United States Patent
Janik et al.

(10) Patent No.: US 6,910,163 B2
(45) Date of Patent: Jun. 21, 2005

(54) METHOD AND CONFIGURATION FOR THE OUTPUT OF BIT ERROR TABLES FROM SEMICONDUCTOR DEVICES

(75) Inventors: Thomas Janik, München (DE); Sebastian Kuhne, Radebeul (DE); Roderick McConnell, München (DE); Detlev Richter, München (DE); Wolfgang Spirkl, Germering (DE)

(73) Assignee: Infineon Technologies AG, Munich (DE)

( * ) Notice: Subject to any disclaimer, the term of this patent is extended or adjusted under 35 U.S.C. 154(b) by 477 days.

(21) Appl. No.: 10/210,015

(22) Filed: Jul. 31, 2002

(65) Prior Publication Data

US 2003/0079164 A1 Apr. 24, 2003

(30) Foreign Application Priority Data

Jul. 31, 2001 (DE) .......................................... 101 37 332

(51) Int. Cl.[7] .............................................. G11C 29/00
(52) U.S. Cl. ........................................ 714/723; 714/733
(58) Field of Search ................................ 714/710, 702, 714/763, 711, 723, 733; 708/422; 707/204

(56) References Cited

U.S. PATENT DOCUMENTS

| | | | | |
|---|---|---|---|---|
| 3,999,051 A | * | 12/1976 | Petschauer | 714/710 |
| 4,485,471 A | * | 11/1984 | Singh et al. | 714/702 |
| 5,239,497 A | * | 8/1993 | McKay et al. | 708/422 |
| 6,023,709 A | * | 2/2000 | Anglin et al. | 707/204 |
| 6,035,432 A | * | 3/2000 | Jeddeloh | 714/763 |
| 6,065,141 A | * | 5/2000 | Kitagawa | 714/711 |
| 6,343,366 B1 | * | 1/2002 | Okitaka | 714/733 |
| 6,480,978 B1 | * | 11/2002 | Roy et al. | 714/724 |

FOREIGN PATENT DOCUMENTS

DE 101 20 255 C2 11/2002

* cited by examiner

Primary Examiner—David Ton
(74) Attorney, Agent, or Firm—Laurence A. Greenberg; Werner H. Stemer; Ralph E. Locher

(57) ABSTRACT

A method and a configuration for the output of bit error tables from semiconductor devices are described. A test control unit reads the bit error table from the memory device following a request from the test apparatus. Then, the bit error tables are transmitted sequentially to the test apparatus for further processing.

19 Claims, 1 Drawing Sheet

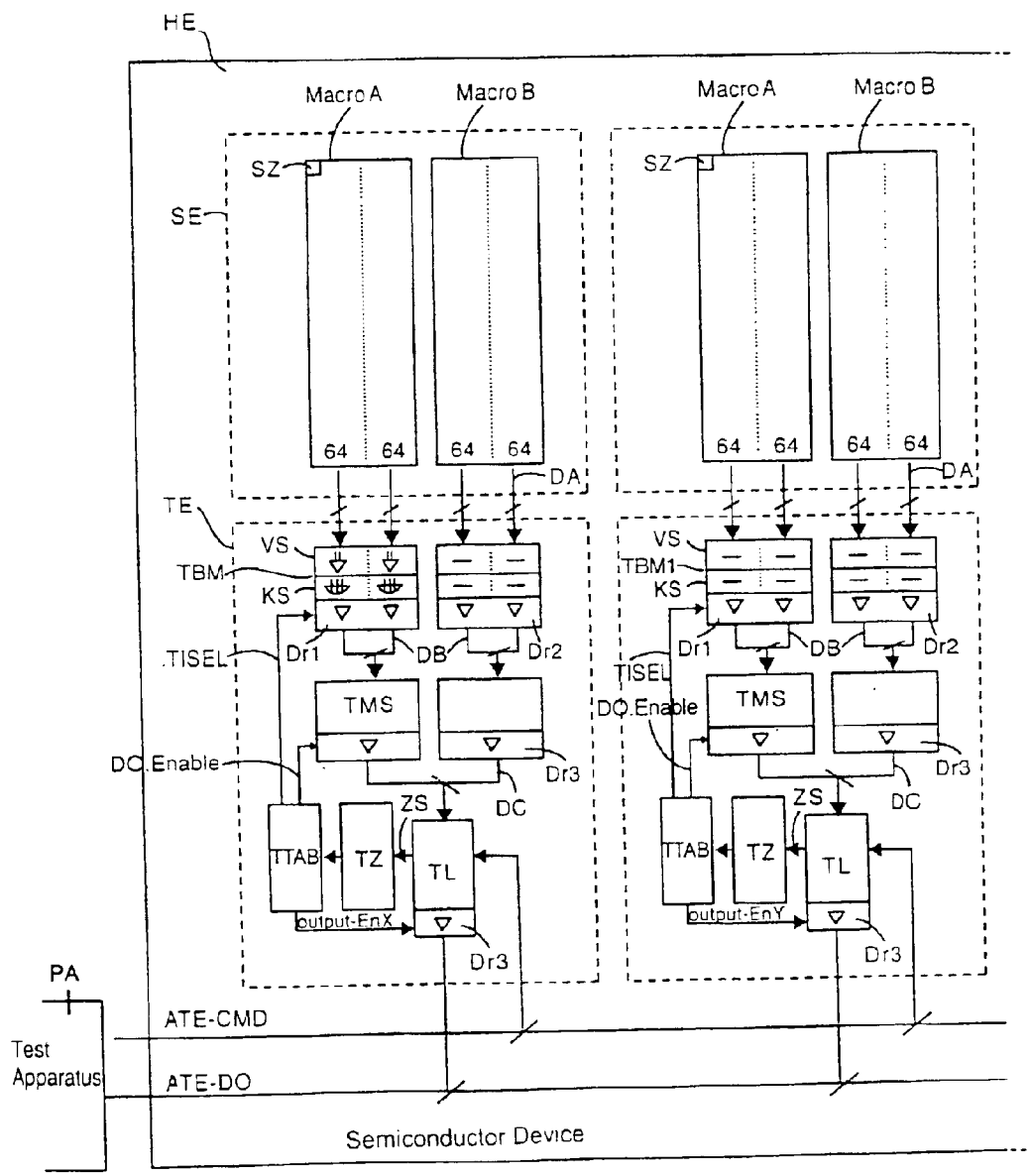

METHOD AND CONFIGURATION FOR THE OUTPUT OF BIT ERROR TABLES FROM SEMICONDUCTOR DEVICES

BACKGROUND OF THE INVENTION

Field of the Invention

The invention relates to a method and a configuration for the output of bit error tables from semiconductor devices.

The number of memory cells in memory devices is generally higher than can be implemented without errors and with an economic yield in the fabrication technology that is common nowadays. It is usual, therefore, for memory devices to contain more than the number of memory cells required for the specification of the memory device. The excess, redundant memory cells are used to replace defective memory cells.

For this purpose, all the memory cells are written with reference data and then read out again. By comparing the data read out with the reference data, defective memory cells are detected. A bit error table is obtained in which each memory cell in the memory device is assigned the information defective/not defective.

By using the bit error table, a replacement scheme is calculated, according to which redundant memory cells are connected to the address lines and therefore replace defective memory cells.

Memory devices may be present as self-contained units (commodity memories). The reading of the bit error table is then carried out by a test apparatus in a straightforward manner, directly via data and address lines.

On the other hand, if a memory device is one of a number of components of a semiconductor device (embedded memory), then the data and address lines are accessible to the test apparatus only in a restricted way, if at all.

Semiconductor devices in which memory devices are present as an embedded memory are systems on a chip (SoC in the following text).

A test device is normally provided on such SoC and, on the SoC, provides an interface via which the test apparatus can make access to the embedded memory, even if with a considerably reduced transmission bandwidth. Therefore, reading the bit error table is possible in the case of embedded memories, but considerably more complicated than in the case of commodity memories.

Furthermore, such semiconductor devices of the SoC type are generally fabricated in a customer-specific manner with a great deal of variability in the internal configuration, small numbers per configuration and high time-to-market requirements.

This therefore results in general terms in the requirement to test semiconductor devices with differently configured memory devices with the lowest possible outlay on modifications to the test apparatus and test programs.

SUMMARY OF THE INVENTION

It is accordingly an object of the invention to provide a method and a configuration for the output of bit error tables from semiconductor devices that overcome the above-mentioned disadvantages of the prior art devices and methods of this general type, in which the requirements on a test environment containing a test apparatus and a test program for the repair of memory cells in embedded memories are reduced, and also to reduce the testing time.

With the foregoing and other objects in view there is provided, in accordance with the invention, a method for outputting at least one bit error table from a semiconductor device to a test apparatus. The semiconductor device has a test control unit and a memory device and the test apparatus operates the test control unit. The method includes reading, via the test control unit, the bit error table from the memory device following a request from the test apparatus, and transmitting the bit error table sequentially to the test apparatus.

In the method according to the invention, by the configuration according to the invention of the semiconductor device, the memory cells written with reference data and belonging to the memory device are read, irrespective of their configuration, and their content is compared with reference data. The bit error table obtained from this is automatically transmitted sequentially to the test apparatus. All the control signals needed for this purpose are generated by the configuration according to the invention.

On SoC, the embedded memory is normally composed of a variable number of memory devices. Each of the memory devices is assigned a dedicated area with redundant memory cells. Accordingly, a dedicated replacement scheme has to be determined for each of the memory devices.

In this case, according to the method of the invention, the memory devices are read simultaneously. Since the transmission to the test apparatus is carried out sequentially, the data is buffered in pipeline stages assigned to the memory devices.

The requirements on the test environment are reduced in as much as a counter in the test apparatus is rendered superfluous, its function having substantially been taken over by the configuration according to the invention on the SoC. The testing time is reduced if other parts of the SoC can be tested during the transmission of the bit error tables.

The configuration (for example number of data bits per address, data bus width) of the memory devices differs for different types of SoCs. In order to be able to handle differently configured memory devices in a standard way, the control signals from the test control unit are adapted.

The adaptation is carried out automatically with templates at an early configuration stage of the SoC. Linked to each template for a memory device is the test control device which is associated and matches the configuration of the memory device, so that in the finished SoC, the test control device always provides the correct signals.

Standardization of the test programs is possible since the communication between the test apparatus and the test control unit is independent of the configuration of the memory devices. A further simplification would be possible if the test program itself determines the number and the configuration of the memory devices on the SoC by using the data transmitted to the test apparatus.

A further reduction in the testing time can be achieved by suitable compression of the bit error table and, as a result, reduced transmission times.

As a rule, individual memory cells are not replaced, instead always entire groups of memory cells. It is then possible to dispense with the transmission of the entire bit error table. The transmission of a compressed bit error table suffices.

The memory cells in the memory devices are normally disposed word by word and can be addressed via column and row addresses.

In a particularly preferred way, in each case a plurality of memory cells within a data word are replaced together. In this case, the compressed bit error table contains only one entry for all the memory cells that can be replaced together, the entry specifying whether all the memory cells are in order or at least one of the memory cells is defective. Compression of this type may be implemented in a preferred way by an OR circuit.

The memory cells can be replaced in groups via a plurality of column addresses, preferably adjacent column addresses.

Accordingly, the compression is carried out by the data words associated with the column addresses combined in this way being read successively with the same row address, compared with the reference data and the result of the comparison being accumulated as error information.

The memory cells can be replaced in a similar way in groups via a plurality of preferably adjacent row addresses.

In accordance with an added mode of the invention, there is the step of building up the semiconductor device from at least two identical memory devices each having an associated test control unit. The associated test control units control the successive transmission of bit error tables to the test apparatus.

In accordance with an additional mode of the invention, there is the step of automatically adapting signals, including an interface select signal and a macro select signal, needed to read the bit error table in terms of a respective address/data structure to different configurations of the memory device.

In accordance with another mode of the invention, there is the step of compressing the bit error table before transmission.

In accordance with a further mode of the invention, there are the steps of composing the memory device from memory cells organized word by word, and carrying out a compression of the bit error table by combining error information from a plurality of the memory cells within one data word.

In accordance with a further added mode of the invention, there are the steps of addressing the memory cells of the memory device via column and row addresses, and carrying out the compression of the bit error table by combining the error information over a plurality of column addresses.

In accordance with another additional mode of the invention, there is the step of carrying out the compression of the bit error table by combining the error information over a plurality of row addresses.

With the foregoing and other objects in view there is provided, in accordance with the invention, a configuration for outputting a bit error table from a semiconductor device to a test apparatus. The configuration being part of the semiconductor device which contains a memory device. The configuration contains a test control unit to be coupled to and controlled by the test apparatus. The test control unit has a counter, a test control table connected to the counter, and two driver stages coupled to the memory device and control a sequential reading of the bit error table from the memory device, irrespective of a configuration of the memory device.

In accordance with an added feature of the invention, the memory device is one of two identical memory devices. The test control unit is one of two test control units each connected to one-of the memory devices. A third driver stage is provided and is connected to the test control table. The test control table outputs memory select signals controlling a successive transmission of a plurality of bit error tables to the test apparatus from the memory devices.

In accordance with an additional feature of the invention, the memory device has memory cells, and the test control unit has a compression stage which combines error information from a plurality of the memory cells from a data word in the memory device organized word by word. The test control unit may have a second compression stage for combining the error information from a plurality of column addresses in the memory device organized by column and row addresses. The test control unit may have a third compression stage for combining the error information from a plurality of row addresses in the memory device organized by column and row addresses.

In accordance with a concomitant feature of the invention, the memory device is an eDRAM.

Other features which are considered as characteristic for the invention are set forth in the appended claims.

Although the invention is illustrated and described herein as embodied in a method and a configuration for the output of bit error tables from semiconductor devices, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWING

The single FIGURE of the drawing is a block circuit diagram of a test apparatus and a semiconductor device, the latter containing a plurality of memory devices each having associated test control units, of which only two are drawn in each case and according to the invention.

DESCRIPTION OF THE PREFERRED EMBODIMENTS

Referring now to the single FIGURE of the invention, there is shown line connections between a test apparatus PA and a semiconductor device HE, only one test control bus ATE_CMD and one test data output bus ATE_DO are shown.

Each memory device SE contains two identical arrays (Macro A, Macro B) having memory cells SZ which, in this case, are configured with a data bus width of 128 bits in each case.

Each test control unit TE contains test control logic TL, which outputs a bit error table to the test data output bus ATE_DO, receives control sequences from the test apparatus PA via the test control bus ATE_CMD and, consequently, starts a counter TZ with a counter start signal ZS.

Via outputs from the multi-digit counter TZ, signal data for an interface select signal TISEL, a macro select signal DO Enable and a memory select signal Output_En (X or Y) are generated in a test control table TTAB.

The memory select signal Output_En is different for each test control unit TE on a semiconductor device HE (X or Y) and controls the successive transmission of a plurality of bit error tables via a third driver stage Dr3.

In addition, all the test control logics TL simultaneously initiate the reading and comparison of the data from the memory devices SE. The data is output to the test control units TE on data buses DA.

The data read via the data bus DA is in this embodiment compared with reference data in a comparison stage VS in a test processing module TBM. Here, error information (defective/not defective) is obtained for each memory cell.

Furthermore, in the embodiment, the error information obtained in this way is compressed in a compression stage KS of a test processing module TBM. For this purpose, the error information from a plurality of, generally adjacent, memory cells belonging to one data word is led to the inputs of an OR circuit. The output from the OR circuit then indicates whether all the memory cells whose error information is led to an input of the OR circuit have no defect, or whether at least one of the memory cells is defective.

Finally, in the test processing module TBM, on the basis of the interface select signal TISEL, the upper or the lower half of the error information from a data word, already compressed in this case, is further passed on to a macro select module TMS via two data buses DB.

Depending on the macro select signal DO_Enable, either the error information for the memory cell array Macro A or for the memory cell array Macro B is transmitted to the test control logic TL via bus lines DC.

On the basis of memory device select signals Output_EnX, Output_EnY, the error information from a memory device in each case is connected from the test control logic TL to the test data output bus ATE-DO.

By the test control table TTAB, the desired sequential output of the error information may be ensured within a bit error table and from error table to bit error table.

For this purpose, a dedicated test control table TTAB is required for each possible configuration of the memory devices.

In the present case, the memory device is an eDRAM.

We claim:

1. A method for outputting at least one bit error table from a semiconductor device to a test apparatus, the semiconductor device having a test control unit and a memory device and the test apparatus operating the test control unit, which comprises the steps of:
   reading, via the test control unit, the bit error table from the memory device following a request from the test apparatus; and
   transmitting the bit error table sequentially to the test apparatus.

2. The method according to claim 1, which comprises building up the semiconductor device from at least two identical memory devices each having an associated test control unit, and the associated test control units controlling a successive transmission of bit error tables to the test apparatus.

3. The method according to claim 1, which comprises automatically adapting signals, including an interface select signal and a macro select signal, needed to read the bit error table in terms of a respective address/data structure to different configurations of the memory device.

4. The method according to claim 1, which comprises compressing the bit error table before transmission.

5. The method according to claim 4, which comprises:
   composing the memory device from memory cells organized word by word; and
   carrying out a compression of the bit error table by combining error information from a plurality of the memory cells within one data word.

6. The method according to claim 5, which comprises:
   addressing the memory cells of the memory device via column and row addresses; and
   carrying out the compression of the bit error table by combining the error information over a plurality of column addresses.

7. The method according to claim 6, which comprises carrying out the compression of the bit error table by combining the error information over a plurality of row addresses.

8. A configuration for outputting a bit error table, comprising:
   a semiconductor device having a test control unit, and a memory device connected to said test control unit, said test control unit having a counter, a test control table connected to said counter, and two driver stages coupled to said memory device and controlling a sequential reading of the bit error table from said memory device, irrespective of a configuration of said memory device; and
   a test apparatus coupled to and operating said test control unit.

9. The configuration according to claim 8,
   wherein said memory device is one of two identical memory devices each having a respective test control unit;
   further comprising a third driver stage; and
   wherein said test control table is connected to said third driver state and outputs memory select signals controlling a successive transmission of a plurality of bit error tables to said test apparatus from said memory devices.

10. The configuration according to claim 8, wherein:
    said memory device has memory cells; and
    said test control unit has a compression stage which combines error information from a plurality of said memory cells from a data word in said memory device organized word by word.

11. The configuration according to claim 10, wherein said test control unit has a second compression stage for combining the error information from a plurality of column addresses in said memory device organized by column and row addresses.

12. The configuration according to claim 11, wherein said test control unit has a third compression stage for combining the error information from a plurality of row addresses in said memory device organized by column and row addresses.

13. The configuration according to claim 8, wherein said memory device is an eDRAM.

14. In a semiconductor device having a memory device, a configuration for outputting a bit error table from the semiconductor device to a test apparatus, the configuration comprising:
    a test control unit to be coupled to and controlled by the test apparatus, said test control unit having a counter, a test control table connected to said counter, and two driver stages coupled to the memory device and controlling a sequential reading of the bit error table from the memory device, irrespective of a configuration of the memory device.

15. The configuration according to claim 14,
    wherein the memory device is one of two identical memory devices;
    wherein said test control unit is one of two test control units each connected to one of the memory devices;
    further comprising a third driver stage; and
    wherein said test control table is connected to said third driver state and outputs memory select signals controlling a successive transmission of a plurality of bit error tables to the test apparatus from the memory devices.

16. The configuration according to claim 14, wherein:

the memory device has memory cells; and said test control unit has a compression stage which combines error information from a plurality of the memory cells from a data word in the memory device organized word by word.

17. The configuration according to claim 16, wherein said test control unit has a second compression stage for combining the error information from a plurality of column addresses in the memory device organized by column and row addresses.

18. The configuration according to claim 17, wherein said test control unit has a third compression stage for combining the error information from a plurality of row addresses in the memory device organized by column and row addresses.

19. The configuration according to claim 14, wherein the memory device is an eDRAM.

* * * * *